United States Patent
Settle, III

(10) Patent No.: US 7,269,584 B2
(45) Date of Patent: *Sep. 11, 2007

(54) METHOD AND APPARATUS FOR MANAGING CONFLICTS OF INTEREST DURING THE SELECTION OF LEGAL AND LEGAL-RELATED SERVICE PROVIDERS

(76) Inventor: Peveril O. Settle, III, 4611 Harley Ave., Ft. Worth, TX (US) 76107-3711

( * ) Notice: Subject to any disclaimer, the term of this patent is extended or adjusted under 35 U.S.C. 154(b) by 350 days.

This patent is subject to a terminal disclaimer.

(21) Appl. No.: 10/340,915

(22) Filed: Jan. 10, 2003

(65) Prior Publication Data

US 2003/0236751 A1 Dec. 25, 2003

Related U.S. Application Data

(63) Continuation-in-part of application No. 09/444,000, filed on Nov. 19, 1999, now Pat. No. 7,158,944.

(60) Provisional application No. 60/348,040, filed on Jan. 11, 2002, provisional application No. 60/110,044, filed on Nov. 26, 1998.

(51) Int. Cl.
*G06F 17/30* (2006.01)
(52) U.S. Cl. ............... 707/3; 707/5; 707/6; 707/100
(58) Field of Classification Search ............... 707/3, 707/5–6, 100
See application file for complete search history.

(56) References Cited

U.S. PATENT DOCUMENTS 5,428,529 A 6/1995 Hartrick et al.

| | | | |
|---|---|---|---|
| 5,862,223 A * | 1/1999 | Walker et al. | ............... 705/50 |
| 5,875,431 A | 2/1999 | Heckman | |
| 6,067,528 A | 5/2000 | Breed et al. | |
| 6,141,653 A | 10/2000 | Conklin et al. | |

(Continued)

FOREIGN PATENT DOCUMENTS

EP 0944008 9/1999

(Continued)

OTHER PUBLICATIONS

PR Newswire, Offer by Solution 6 Holdings Limited for Elite Information Group Inc., Dec. 16, 1999.

(Continued)

*Primary Examiner*—Cam Linh Nguyen
(74) *Attorney, Agent, or Firm*—Vinson & Elkins L.L.P.

(57) ABSTRACT

A client initially creates a client's request for proposal (RFP) on a client computer. The client also enters information that identifies some of the client's opponents. Next, a service provider creates a service provider profile on a service provider computer. The service provider also enters information that identifies some of the service provider's clients. Next, all of this information is transmitted to a host site computer that is in communication with the service provider computer and the client computer. The host site computer then compares the information identifying the client's opponents to the information identifying the service provider's clients to determine if the service provider should be allowed access to the client's RFP. If one of the service provider's clients is the same as one of the client's opponents, the service provider is refused access to the client's RFP.

24 Claims, 9 Drawing Sheets

U.S. PATENT DOCUMENTS

| | | | |
|---|---|---|---|
| 6,230,199 B1 * | 5/2001 | Revashetti et al. | 709/224 |
| 6,285,987 B1 | 9/2001 | Roth | |
| 6,298,327 B1 | 10/2001 | Hunter et al. | |
| 6,301,574 B1 | 10/2001 | Thomas et al. | |
| 6,345,260 B1 | 2/2002 | Cummings et al. | |
| 6,470,338 B1 | 10/2002 | Rizzo et al. | |
| 2002/0010608 A1 * | 1/2002 | Faber et al. | 705/8 |

FOREIGN PATENT DOCUMENTS

| | | |
|---|---|---|
| WO | WO99/42935 | 8/1999 |
| WO | WO01/09781 | 2/2001 |
| WO | WO01/043008 | 6/2001 |

OTHER PUBLICATIONS

Wayback machine web page for www.solution6.com.

Gasparino, Charles, Competing firms say orange county RFP is for show, Bond Buyer, Dec. 29, 1994, vol. 310, Iss. 29556.

Dorner, B.L., Joining the internet wave information for lawyers, Law Practice Management, Jul.-Aug. 1996, v. 22, No. 5, XP000933535, p. 1, col. 1.

CaseMatch "CaseMatch, a free service, is available in all states" http://www.casematch.com.

CaseMatch "What is CaseMatch?" http://www.casematch.com/whatis.html.

CaseMatch "For Attorneys" http://www.casematch.com/atty.html.

TheLaw.com (home page) http://www.thelaw.com/home.

TheLaw.com "Find a Lawyer" http://www.thelaw.com/findalawyer/1,1106,,00.html.

AskTheLawyers.com (home page) http://www.askthelawyers.com.

AskTheLawyers.com "Frequently Asked Questions" http://www.askthelawyers.com/faq.htm.

eLawForum.com (home page) http://www.eLaw.com eLawForum.com (howitworks.

Houstonlawyers.com (home page) http://www.houstonlawyers.com houstonlawyers.com (about us).

Voorhees, Mark, "Market Makers," The American Lawyer, Apr. 1999, at 29.

"Report on Selection of Outside Counsel by Corporations" Greater New York chapter of the American Corporate Counsel Assoc. Jul. 15, 1997 http://www.acca.com/chapters/reportext.htm.

Register.com domain name search engine—lawyers.com and freeadvice.com

FreeAdvice.com (1995).

Lawyers.com Web Site.

* cited by examiner

| LISTING NUMBER | LISTING CLIENT | AREA OF PRACTICE | WORK DESCRIPTION | GEOGRAPHIC AREA | REQUIREMENTS/ PREFERENCES | RESPONSE DEADLINE |
|---|---|---|---|---|---|---|
| TX0699A0023 | AMERICAN BANCORP | BANKRUPTCY/ CREDITORS RIGHTS | REPRESENTATION IN APPROX. 35 PENDING CASES RE: UNSECURED CREDIT CARD ACCTS. | PRIMARILY IN SOUTHERN DIST. TX | SBOT REQ. | DECEMBER 4, 1999 |
| TX0699A0028 | ANONYMOUS (CONSTRUCTION SRVCS CO.) | BANKRUPTCY | PUBLICLY-HELD CO. SEEKING LEAD COUNSEL FOR CH. 11 FILING | HOUSTON, TX/ SOUTHERN DISTRICT | SBOT & S.D. TX REQ. | DECEMBER 15, 1999 |
| TX0699A0047 | ANONYMOUS (SEMICONDUCTOR MFG. CO.) | BANKRUPTCY; INTELLECTUAL PROPERTY | COUNSEL SOUGHT TO DEFEND ADVERSARY PROCEEDING ALLEGING PATENT INFRINGEMENT | DALLAS, TX/ NORTHERN DISTRICT | SBOT & N.D. TX REQ. | EXTENDED TO DECEMBER 11, 1999 |
| US0799A0059 | ANONYMOUS (DATA COMMUNICATIONS SERVICE PROVIDER) | COLLECTIONS | AUSTIN, TX-BASED CO. NEEDS COUNSEL TO OVERSEE COLLECTIONS RE: APPROX 150 ACCTS. | NATIONAL | NATIONAL FIRM PREFERRED | JANUARY 15, 2000 |
| LA0699H0008 | BALTHUS DRILLING CO. | BANKRUPTCY; CREDITORS RIGHTS; OIL AND GAS | BEAUMONT TX-BASED CO. SEEKS COUNSEL TO PURSUE CLAIMS RE: OILFIELD EQUIPMENT LEASE IN OAKMONT PROD. CO. BANKRUPTCY | EASTERN DISTRICT LA (NEW ORLEANS) | E.D. LA REQ. | NOVEMBER 29, 1999 |
| TX1099C0018 | COMSTOCK PARTNERS | CONTRACT LITIGATION | COUNSEL TO DEFEND RE: ALLEGED BREACH OF JOINT VENTURE AGREEMENT WITH PRAXIS CORP. | WITCHITA FALLS, TX (78TH DISTRICT CT.) | SBOT REQ. | NOVEMBER 18, 1999 |
| LISTING NUMBER | LISTING CLIENT | AREA OF PRACTICE | WORK DESCRIPTION | GEOGRAPHIC AREA | REQUIREMENTS/ PREFERENCES | RESPONSE DEADLINE |

FIG. 4A

| LISTING NUMBER | LISTING CLIENT | AREA OF PRACTICE | WORK DESCRIPTION | GEOGRAPHIC AREA | REQUIREMENTS/ PREFERENCES | RESPONSE DEADLINE |
|---|---|---|---|---|---|---|
| TX0699A0023 | AMERICAN BANCORP | BANKRUPTCY/ CREDITORS RIGHTS | REPRESENTATION IN APPROX. 35 PENDING CASES RE: UNSECURED CREDIT CARD ACCTS. | PRIMARILY IN SOUTHERN DIST. TX | SBOT REQ. | DECEMBER 4, 1999 |
| TX0699A0028 | ANONYMOUS (CONSTRUCTION SRVCS CO.) | BANKRUPTCY | PUBLICLY-HELD CO. SEEKING LEAD COUNSEL FOR CH. 11 FILING | HOUSTON, TX/ SOUTHERN DISTRICT | SBOT & S.D. TX REQ. | DECEMBER 15, 1999 |
| TX0699A0047 | ANONYMOUS (SEMICONDUCTOR MFG. CO.) | BANKRUPTCY; INTELLECTUAL PROPERTY | COUNSEL SOUGHT TO DEFEND ADVERSARY PROCEEDING ALLEGING PATENT INFRINGEMENT | DALLAS, TX/ NORTHERN DISTRICT | SBOT & N.D. TX REQ. | EXTENDED TO DECEMBER 11, 1999 |
| TX0699A0017 | ANONYMOUS (PROFESSIONAL MEDICAL SERVICES PROVIDER) | REORGANIZATIONS AND/OR BANKRUPTCY | ASSISTANCE IN REORGANIZATION/ REHABILITATION EFFORTS AND WITH POTENTIAL CH. 11 FILING | DALLAS, TX | SBOT & USDC FOR N.D. TX REQ. | FEBRUARY 18, 2000 |
| LA0699H0008 | BALTHUS DRILLING CO. | BANKRUPTCY; CREDITORS RIGHTS; OIL AND GAS | BEAUMONT TX-BASED CO. SEEKS COUNSEL TO PURSUE CLAIMS RE: OILFIELD EQUIPMENT LEASE IN OAKMONT PROD. CO. BANKRUPTCY | EASTERN DISTRICT LA (NEW ORLEANS) | E.D. LA REQ. | NOVEMBER 29, 1999 |
| TX0699H0008 | HEILMAN FINANCIAL CORP. | BANKRUPTCY | COUNSEL SOUGHT TO REPRESENT ITS INTERESTS AS A CREDITOR IN INTERTECH'S CH. 11 PROCEEDINGS | DALLAS, TX (N.D.) | N.D. TX REQ. | JANUARY 13, 2000 |
| LISTING NUMBER | LISTING CLIENT | AREA OF PRACTICE | WORK DESCRIPTION | GEOGRAPHIC AREA | REQUIREMENTS/ PREFERENCES | RESPONSE DEADLINE |

FIG. 4B

"Private" Search and Select

Select the current Paladin-Select subscribers which you do want to be accorded access to your listing by selecting the box at left:

Legend:

| AA | BB | CC | DD | Blank |
|---|---|---|---|---|
| Significant client relationships / More information | Significant client relationship | Significant adversarial relationship / More information | Significant adversarial relationship | Means a subscriber is not a member of Auto-Conflicts® |

| | | | |
|---|---|---|---|
| [x] | AA | DD | Ashley, Stevens & Proxmire - Los Angeles, CA |
| [x] | AA | CC | Atkins & Moss - Long Beach, CA |
| [ ] | BB | CC | Barr & Miller - San Francisco, CA |
| [ ] | BB | DD | Bridges, Feinstein & Cribbs - Oakland, CA |
| [x] | BB | DD | Carson & Summers - Los Angeles, CA |
| [ ] | AA | CC | Carstairs, Porter & Morris - Sacramento, CA |
| [ ] | AA | CC | Dinkins & McLane - San Francisco, CA |
| [ ] | | | Dorr, Platt & Dinkelmeyer - San Diego, CA |

Fig. 10

METHOD AND APPARATUS FOR MANAGING CONFLICTS OF INTEREST DURING THE SELECTION OF LEGAL AND LEGAL-RELATED SERVICE PROVIDERS

REFERENCE TO EARLIER FILED APPLICATION

This application is a continuation-in-part application of application Ser. No. 09/444,000, filed on Nov. 19, 1999, now U.S. Pat. No. 7,158,944, which, in turn, claims the benefits of U.S. Provisional Application No. 60/110,044, filed Nov. 26, 1998, and U.S. Provisional Application No. 60/348,040, filed Jan. 11, 2002.

BACKGROUND OF THE INVENTION

1. Technical Field

The present invention relates generally to managing and avoiding conflicts of interest when utilizing a communications network site on which persons in need of certain services can post requests for proposals (RFPs) from service providers for the provision of the services required. More specifically, the present invention pertains to a method and apparatus for allowing persons with legal-related needs and legal service providers to list entities with which they have similar and adversarial interest. These entities can then be cross checked against one another to determine if any conflict of interest issues are present.

2. Description of the Related Art

As ever-increasing numbers of computer users secure access to the Internet, a wide variety of new and existing business enterprises are likewise in increasing numbers establishing their own web sites to expand their own business opportunities. In its extant evolving form, perhaps the most significant advantage of the Internet is one's ability to reach large numbers of people at a relatively low cost.

In its infancy, the "first wave" of commerce on the Internet consisted of simple marketing/promotion sites. Today, several types of web sites exist which offer things such as computer hardware and software, books, music and the like for sale over the Internet. One can access these sites, select any products they like, and then purchase the same via credit card, typically through an account arrangement with a third party credit verification/validation agency such as Cybercash or Verisign. These sites, essentially entailing simple order-taking, epitomize the "second wave" of business applications.

An ensuing variation of these kinds of sites are "auction" sites, which liquidate surplus electronic equipment inventories (computers, portable video recorders and VCRs, CD players, etc.) and other items either by bid (such as EBay and Onsale), where again the actual credit transactions are typically processed via third party arrangements with the purchaser's credit card being charged for the goods and any associated handling charges, and the goods then shipped to the purchaser, or by barter (such as FastParts); similar sites entail specialized collectibles (such as eworldauction.com) and commodities (such as energymarket.com). Many of these other types of sites either utilize other types of payment arrangements, such as separate escrow account arrangements, or effect transactions only if the buyer and seller reach acceptable terms of payment.

As compared to goods, services can be more difficult to sell over the Internet. When one purchases a brand-name computer or CD over the Internet, they do so with the expectation that the quality of those products will be same as the counterparts they could have purchased at a local retailer. This same element of relative confidence is characteristic of the existing web sites which serve as an open market for the provision of services by competing service providers, because those services are by their very nature comparatively generic and commodity-like, such as airline tickets/service (e.g., priceline.com), long-distance service blocks (e.g., arbinet.com) and shipping/freight services (e.g., The Internet Truckstop).

However, in other instances, no two service providers ordinarily provide the same level of service for a given task or project, and both the quality of those services provided and the price charged for those services can vary widely. These divergent elements are particularly characteristic of certain types of professional services, and perhaps most so in the case of many legal services.

Moreover, other elements or characteristics are virtually unique to the provision of most legal services and/or the selection/engagement process between the client and attorney: (i) the avoidance of conflicts of interest; (ii) the establishment and preservation of the attorney-client privilege; and (iii) the plain desire of clients in many instances to not have their business or legal needs broadcast to their opponents or competitors, or interested or casual observers, or strangers.

Also, due to the differentiation in the laws and rules of procedure as among the various states (and countries), and the corresponding certification, regulation and licensing of attorneys by each of those sovereigns' judicial systems, most lawyers are licensed to practice in only one state (or country), and those licensed to practice in two or more are the exception; of course, particularly in the last quarter century, a number of large law firms have dealt with this dilemma by establishing offices in different states (and/or countries) to extend their ability to serve their clients, particularly in other major centers of commerce or government, with attorneys licensed to practice in those areas, but even today not a single law firm has a truly nationwide (much less global) practice.

Conversely, in the same last quarter century, a broad array of businesses in increasing numbers have extended their substantive operations both nationwide and worldwide through their own internal growth and/or via merger and consolidation; the legal needs of many of those companies, particularly in terms of dealing with any litigation arising in these extended spheres of operation, have likewise expanded both geographically and geometrically.

Yet companies today essentially still have only the traditional means and methods of selecting counsel to service their expanding needs: either utilizing existing counsel to service those needs, or selecting other counsel based on recommendations or referrals by their existing counsel or selecting other counsel based on word-of-mouth via their peers, or on general reputation and/or recent publicity. By their very nature, these existing methods are inherently narrow in terms of the scope of choice attained in comparison to the universe of the potential providers of such services.

And while the comparatively recent advent of lawyer and law firm advertising has served to at least somewhat expand the scope of choice between providers of legal services in some areas of practice, that advertising is most suited for, and therefore most typically oriented to, either high volume applications (e.g., divorce cases, workers compensation claims, individual bankruptcies, traffic tickets) or prospective high-dollar tort claims, and is only rarely utilized to promote a lawyer's or firm's availability and expertise regarding general business applications. Moreover, advertising itself does nothing to further facilitate, enhance or expedite the traditional means or processes of selection described above.

The present invention utilizes a computer-based communications network to provide client users the opportunity to significantly expand their scope of choice as between prospective providers of services to meet their particular needs, and to acquire significant comparative data regarding both pricing and strategic resource availability in comparative terms based on their own delineated criteria, while incorporating appropriate mechanisms and protocols to identify and avoid conflicts of interest, and to maintain client confidentiality if and as needed or desired. As significantly, it enables subscribing legal service providers to become aware of potential clients in need of specific services which they may (or may not) be in a position to provide, via a mechanism which has not heretofore existed and which serves to enhance and complement the traditional means and methods by which providers of these services have been selected in the past. The present invention will serve to substantively automate, enhance and expedite the underlying processes facilitating the selection of a service provider based on the customized specifications of the client.

It is therefore one object of the present invention to provide an Internet (or other advanced communications network) site which allows persons and companies to broadcast their specific legal/legal-related needs by listing requests for proposals (RFPs).

It is yet another object of the present invention to otherwise limit the access to the client listings on said site to licensed attorneys, law firms and certain other professionals in legal-related areas (i.e., those persons generally obligated to adhere to the tenets of client confidentiality), and to require by subscription agreement that those who seek, and are afforded access to any given listing will maintain the confidentiality of any material information they acquire by virtue of same as they would with any like information acquired in the course of considering any prospective engagement.

It is yet another object of the present invention for the site to allow such persons and companies posting RFPs to limit access to same to only those attorneys or law firms they specify by name, or to deselect certain subscriber attorneys or law firms which either have existing identifiable conflicts of interest or who the listing party does not otherwise desire to have access to such listing (such as a former service provider with whom they have previously severed ties), or by geographic area and/or substantive area of practice.

It is yet another object of the present invention for the site to allow the attorneys or law firms (or other legal-related professionals) as are accorded access to any given RFP listings to submit proposals to provide the requested legal services should they choose to do so.

It is yet another object of the present invention to provide mechanisms to identify and avert actual or potential conflicts of interest before an engagement occurs.

SUMMARY OF THE INVENTION

When characterized as a method, a client initially creates a client's request for proposal (RFP) on a client computer. The client also enters information that identifies some of the client's opponents. Next, a service provider creates a service provider profile on a service provider computer. The service provider also enters information that identifies some of the service provider's clients. Next, all of this information is transmitted to a host site computer that is in communication with the service provider computer and the client computer. The host site computer then compares the information identifying the client's opponents to the information identifying the service provider's clients to determine if the service provider should be allowed access to the client's RFP. If one of the service provider's clients is the same as one of the client's opponents, the service provider is refused access to the client's RFP.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 4A and 4B are sample listings of RFPs for different subscribers;

FIG. 10 is a screen image showing a list of subscribers.

DETAILED DESCRIPTION OF THE INVENTION

The present invention is a computerized system forming a computer based communications network for displaying requests for proposals (RFPs) submitted by registered listing clients delineating their particular legal/legal-related service needs and any associated specifications they may have pertaining to the same, to a spectrum of potential legal/legal-related service providers who are subscribers to the network.

Figure 1:
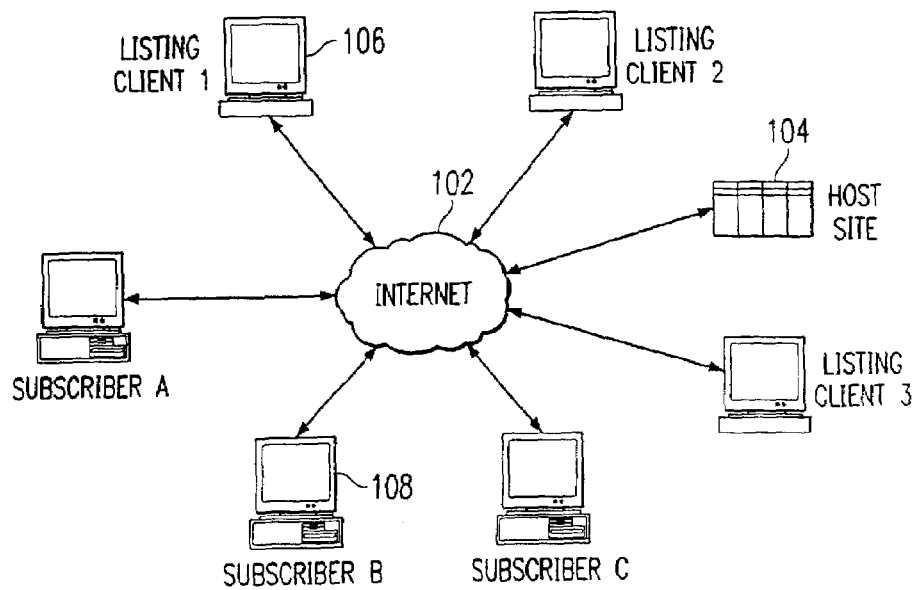
FIG. 1 illustrates a communications network and a series of computers upon which the present invention can be implemented.

FIG. 1 illustrates a network upon which the present invention can be implemented. As shown in FIG. 1, host network 102 is the global network of computers known as the Internet. Host network 102 can also be implemented using a private access wide area network (WAN). Attached to host network 102 is host site 104, listing clients 106, and subscribers 108. Host site 104, listing clients 106, and subscribers 108 can be implemented using any general purpose computer configured to send and receive information via host network 102. Computers sold by Dell, Compaq, Sun and others, possibly under the control of a windows-based operating system by Microsoft, and operating as described below can be used to implement host site 104, listing clients 106, and subscribers 108. Given the inherently sensitive nature of the transactions involved, host site 104 incorporates both discrete security protocols and privacy protocols, and will actively enable encrypted authenticated transmissions between host site 104, listing clients 106, and subscribers 108. Not shown in FIG. 1 are the many intermediate nodes and other pieces of equipment that are required to allow host network 102 to function or that allow host site 104, listing clients 106, and subscribers 108 to connect and communicate via host network 102, as one of ordinary skill in the art has such knowledge.

Although the description of FIG. 1 presented above contemplates that the listing clients and subscribers will be implemented using traditional personal computers, a variety of other communication devices can be used in place of these personal computers. For example, personal digital assistants (PDAs) and cellular phones are now capable of transmitting and receiving data from the Internet. Since these devices can send and receive data over the Internet, they can perform all of the tasks required by the listing client computers and subscriber computers, as these computers are used in the present invention. Thus, any device that can transmit and receive information from a global network of computers (such as the Internet) is, for the purposes of the specification and claims, to be considered a computer.

The present invention services two discrete types of users: listing clients and network subscribers. Although the host site could functionally accommodate an actual engagement process, its primary intended functions are (i) to enhance the range of choice afforded to listing clients by potential legal service providers beyond, if not well beyond, that otherwise afforded by present conventional means, and (ii) to substantially enhance the ability of service providers to become aware of persons in need of specific legal services and to submit proposals to provide same.

Figure 2:
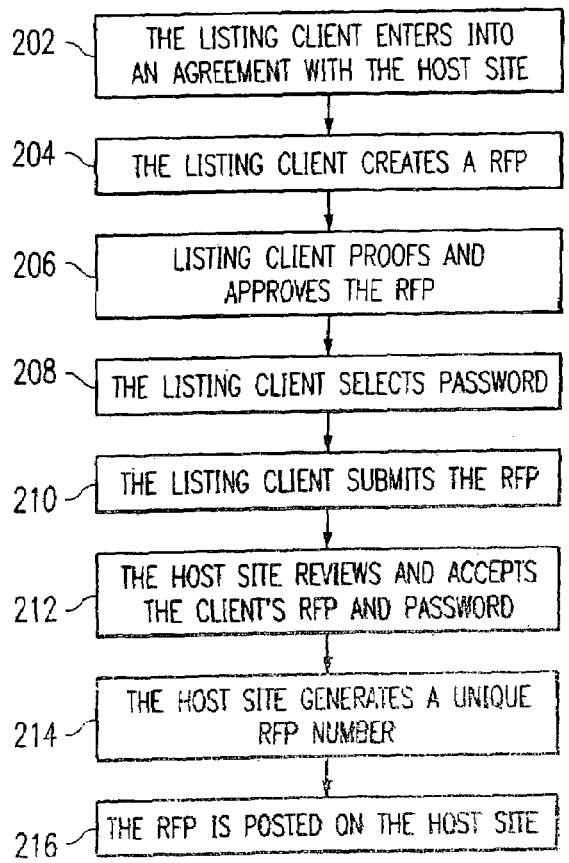
FIG. 2 is a flowchart illustrating how a client posts a RFP.

FIG. 2 is a flowchart that depicts how a person or entity in need of legal/legal-related services for a particular purpose becomes a listing client and submits a request for proposal (RFP). As used herein, the term "legal-related services" includes business and financial services, e.g., services such as accounting, financing, consulting, and other professional services. Although these types of services are not currently considered by most as being legal-related services, current trends suggest that legal services may, in the near future, be paired with other business related services. Since the present invention can accommodate a variety of legal and business related services, such business and financial related services should be considered within the scope of this invention. Initially, the person enters into a listing agreement with the host site (202). The listing agreement includes important background information about the client, and may create a fiduciary relationship between the operators of the host site and the listing client. After executing the listing agreement, the listing client creates a RFP (204). Once the RFP is created, the client is given the opportunity to proofread the RFP, and approve it for listing on the host site (206). Once the final version of the RFP is approved by the client, and if the client has not previously been issued a password to allow access to the host site, the client is prompted to select a password for future access to the host site (208). After approving the RFP, the client submits the RFP to the host site (210). This RFP delineates the particular services needed, together with whatever factual particulars, and limiting criteria, relating to same that they deem pertinent so as to enable prospective service providers to submit responsive proposals. While the RFP may alternatively be submitted in hard copy form, both to avoid transcription errors and/or loss in transit, its composition and submission electronically in standard text form (e.g., XML, HTML, or ASCII) on a macro template provided by the host site, via a secure channel provided by the network, is the preferred method. In conjunction with the submission of a RFP, the listing client is asked to designate a listing protocol, to select a conflicts check protocol and to specify both a start date for the listing and a closing date/deadline for submission of proposals in response to the listing.

To assist in the formulation of RFPs by its listing clients, the host site may also provide listing clients access to a menu of the types of specifications, terms and provisions that may be included in a RFP. The menu may also provide a listing client access to a compilation of model or exemplar provisions. From this menu, the listing client can select items for inclusion in their RFP via, for example, a point-and-click mechanism. Once a given model provision is imported into the RFP being composed, it can then be edited by the listing client to suit its particular circumstance. The model provisions compiled by the host site would be representative of the range of provisions typically included in RFPs of the type being created by the listing client, and would enable the listing client to compose a RFP much more quickly than if it had to be drafted from scratch.

An important part of the RFP addresses conflict of interest (COI) issues. The present invention incorporates COI protocols, some of which are in control of the listing client, and some of which are in the control of the subscriber, as described more fully below.

Listing clients can limit access to their RFP to specified subscribers, thereby creating functional "private listings." While this feature has a variety of potential uses and applications, one particular use is to limit access to the listing to only those attorneys/firms with whom the listing client already has a pre-existing attorney-client relationship. Listing clients may also include in these private listings attorneys/firms that have previously verified that they would have no COI problems in representing the listing client.

The listing client can also specify the characteristics that an attorney/firm must have in order to view the listing client's RFP. For example, the listing client can require a network subscriber to be a specialist in a certain area of law, or to be primarily (or exclusively) focused in representing plaintiffs or defendants before gaining access to the RFP. Thus, if a listing client has been accused of infringing another's patent, that listing client can require that only network subscribers who hold themselves out as having expertise in the field of intellectual property can view the RFP. Similarly, an insurance company needing representation in a series of personal injury cases can require that only network subscribers who regularly represent insurance companies (as opposed to individual plaintiffs) can view its RFPs.

In addition, the present invention implements a "lock-out" feature capability that is the mirror reverse of the "private listing" option. The "lock out" feature allows a listing client to specify that particular service providers (if otherwise network subscribers) not be accorded access to their RFP listing. This feature enables listing clients to proactively preclude firms with whom they are currently in litigation and/or firms of which they are aware already have either an actual or probable COI from obtaining access to any RFP which either may contain sensitive information, or of which the client otherwise does not want those service providers to be aware. These two options allow a listing client to further compartmentalize subscriber access to a particular listing and enhance the ability of the present invention to manage COI issues.

The listing client's RFP and password are then reviewed and approved by the host site (212). The host site verifies/confirms the selection of any conflicts check protocols and the insertion of any appropriate default protocols. If the client's password is a duplicate of another client's password, or if the client did not supply the necessary information in their RFP, the host site will notify the client, and ask them to submit another password and/or complete the RFP. Assuming the password and RFP are approved by the host site, the host site issues the listing client a discrete RFP listing number for that RFP (214). The listing client uses the RFP listing number in conjunction with the password to access response and other replies submitted by network subscribers to the RFP, and to edit the RFP if needed. Finally, the host site posts the RFP where network subscribers can review the RFP and submit proposal in response to the RFP, as will be discussed in more detail below (216).

After submitting a RFP and the appropriate password/listing number, the host site affords the listing client access to information specific to the client's listing(s), consisting of subscriber proposals submitted in specific response to their posted RFP(s) or subscriber requests for clarification of any criteria or specifications delineated in a listing. The host site also allows the listing client to edit/amend their own listings so as to, inter alia, make any modifications or further clarifications they subsequently deem necessary or appropriate, or to terminate a given listing, or to extend a given listing response deadline.

Figure 3:
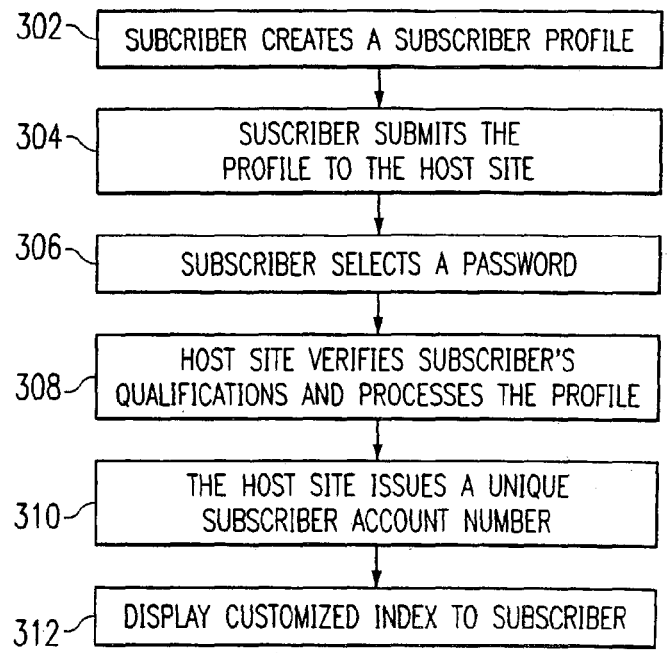
FIG. 3 is a flowchart illustrating how a subscriber gains access to a list of RFPs.

FIG. 3 illustrates a method whereby a person or entity becomes a subscriber to the host site. Initially, the subscriber completes a subscriber profile in which they describe various characteristics of their practice (302). Given that many professional legal/legal-related needs are regarded as being inherently sensitive in nature, the substantive advancements in ease and range of accessibility achieved by the present invention are balanced/offset via the incorporation of an array of protective protocols, including compartmentalization controls, such that subscribers are afforded access only to listings pertaining to their professional discipline and/or area of practice, e.g., accident reconstruction experts are not accorded access to listings for forensic accounting experts, and neither can obtain access to RFP listings for legal services; legal practitioners cannot obtain access to either type of listing (except their own listings, if any, for such services).

Subscribers are required to delineate their service provider profile via specification of their particular professional discipline(s) and their particular areas of practice in terms of subject matter, and as to whether they are either board-certified or possess other special credentials in any one or more of those areas of practice. The latter can be of significance since some listing clients may, for example, specify board certification in a particular area either as an eligibility requirement for persons submitting bids to their RFP listing (if not as a gateway for having access to that listing), while the former also serves as a pro-active filter/matrix in determining, in part, the composition of the listing index display for that particular subscriber. After completing a profile, the subscriber submits the profile to the host site (304).

Concurrent with the submission of the profile, the subscriber is permitted to select a password (306), which, when combined with the account number described in step 310 below, is functionally utilized as a passkey to obtain access to the index of RFP listings as shown in step 312.

After the host site receives the profile, the host site processes the subscriber's profile and verifies that the person or entity applying to become a subscriber meets certain qualifications (308). Subscriptions to the host site are limited to providers of legal or legal-related services. To become subscribers, attorneys must verify that they are licensed and in good standing to practice law in one or more states, and law firms (or their functional equivalents, including professional corporations and limited liability corporations encompassing a legal practice) must designate one or more partners or shareholders having such status. The state(s) in which a lawyer (or members of a law firm) is licensed also form part of the given subscriber's user profile, which in turn is determinative of the listings to which they would ordinarily be accorded access. Likewise, legal-related service providers, which may include a variety of professionals, including e.g., professional economists, forensic accountants and engineers, and academicians in various disciplines, are likewise required to verify their licenses and/or credentials as part of the subscription enrollment process. These verifications will be subject to independent cross-check by the host site.

Listing clients typically will not become subscribers to the host site, given that network subscriptions are limited to professional service providers. However, some subscribers to the host site may also become listing clients, since the network also enables subscribing professional service provider firms to post their own listings for local counsel, or specialized counsel or expert needs.

As part of the subscription enrollment procedure, service providers have entered into contracts which expressly acknowledge their understanding and agreement that the information contained in RFPs is being provided by listing clients solely for the purpose of enabling subscribing service providers to determine whether they are or are not in a position to provide the requested professional services, and, if so, whether and on what basis they propose to do so, and that such information is deemed to have been provided to the subscriber in the same confidence as if the client had consulted said service provider directly in person.

After verifying the subscriber's identity and qualifications, the host site issues the subscriber a unique subscription account number (310), which when paired with the password selected by the subscriber as described in step 306, gives the subscriber access to a customized index of current listings, which provides a summary description of each current listing in the subscriber's specified service areas (geographic and subject matter), including a brief generic statement of the type of services requested (as specified by the client or by host default), the pertinent geographic area (if any), and which may or may not also identify the listing client by name (312). This customized index also takes into account any private listing or lock-out specifications contained in the various RFPs.

FIG. 4A is a hypothetical sample index of RFP listings that might be displayed for a given law firm subscriber, being one which was presumably based in Texas or had attorneys licensed to practice in that state, and one which also presumably specified the areas of "bankruptcy", "collections" and either "contract law" or "contract litigation" in its subscriber profile, and presumably may also have specified that firm members were admitted to practice in the bankruptcy courts of the geographical federal districts specified. FIG. 4B is a second hypothetical index of listings that might contemporaneously be displayed for another law firm subscriber that also listed "bankruptcy" as an active area of its practice, but did not specify "collections", "contract law" or "contract litigation" as additional areas of practice in its profile (although the latter firm may also have listed "creditors rights" or "intellectual property" as additional specified subject matter areas within its practice)."

Accordingly, the customized index may be referred to as an "active index." The host site, operating according to present invention, compares a given subscriber's user profile criteria against listing client RFP specifications to create a unique, customized index of current RFP listings for that subscriber. The active index is continuously updated, as any pertinent new listings are automatically added, and earlier listings are deleted on expiration of specified RFP response deadlines. The active index may also delete index listings at the subscriber's option following an initial review, or otherwise "flag" such listings as having already been reviewed. Listings that have been previously "flagged" are visually highlighted when subsequently presented to a subscriber.

Figure 5:
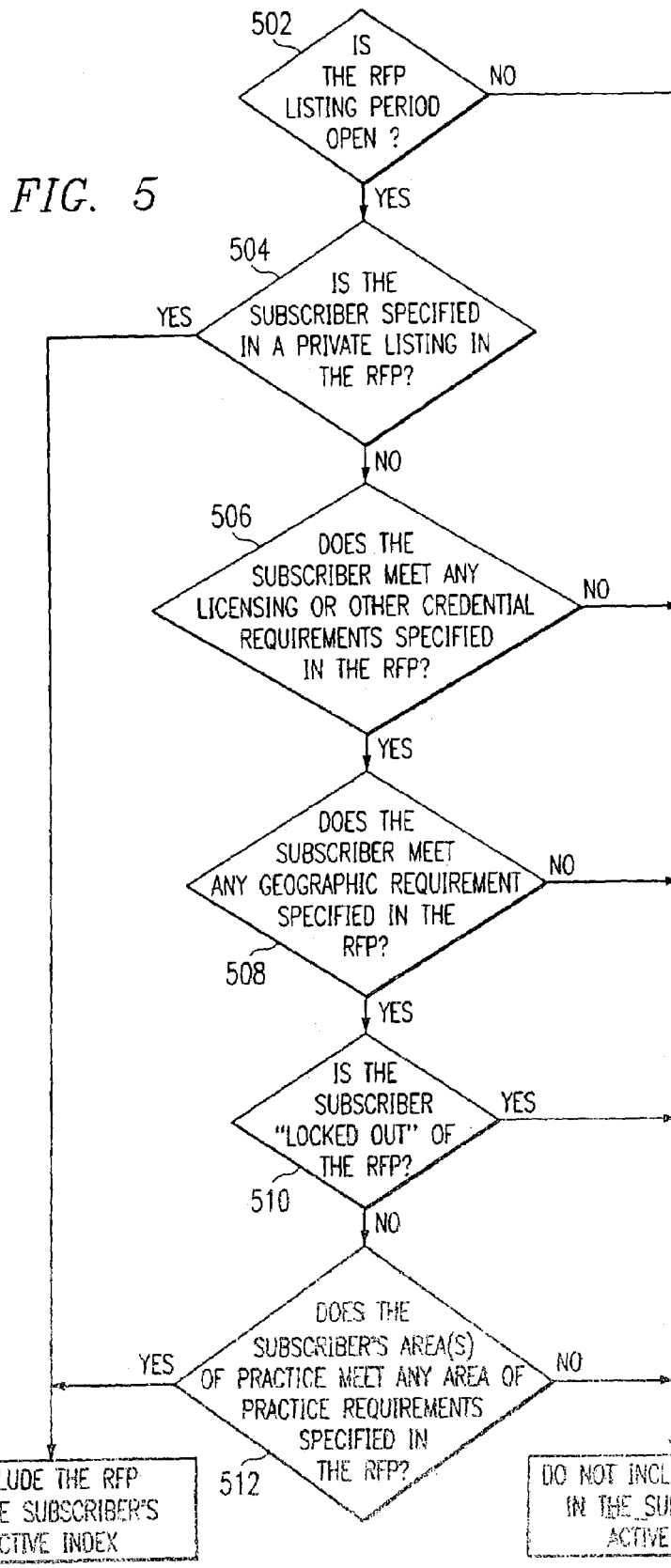
FIG. 5 is a flowchart showing the method by which a subscriber's active index of RFPs is formed.

FIG. 5 is a flowchart which illustrates the method for determining whether a particular RFP will appear in a subscriber's active index. Initially, the host site determines whether the RFP listing period is open (502). When creating a RFP, the listing client may specify a certain time period that the RFP will be available to subscribers. If the time period requirement specified by the listing client is not met, the RFP will not be listed in the subscriber's active index (518). Next, the host site determines whether the particular subscriber was specified by the listing client as being one of the attorneys or firms noted in a private listing for the particular RFP (504). If the subscriber was specified in a private listing for the RFP, the RFP will be included in the subscriber's active index, as long as the subscriber has not deleted the RFP from a previous index (516). If the subscriber was not specified in a private listing, the host site next determines whether the subscriber meets any licensing or other credential requirements specified by the listing client in the RFP (506). If the subscriber does not meet these requirements, processing continues at step 518. If the subscriber meets the licensing or other credential requirements, or if no licensing or credential requirements are specified, the host site will determine whether the subscriber meets any geographic requirements specified in the RFP (508). If the subscriber does not meet the geographic requirements, processing continues at step 518. If the subscriber does meet the geographic requirements specified in the RFP, or if no geographic requirements are specified, the host site determines whether the subscriber was specified in the RFP as one of the attorneys or firms that was "locked out" by the listing client for this RFP (510). If the subscriber was locked out, processing continues at step 518. If the subscriber was not locked out, the host site determines whether the subscriber's area(s) of practice meet any area of practice requirements or plaintiff/defendant orientation requirements specified in the RFP (512). If the subscriber does not meet the area of practice or orientation requirements, processing continues at step 518. Otherwise, the RFP will be included in the subscriber's active index (516). (For the purposes of this invention, steps 504-512 can be implemented in a order other than that shown in FIG. 5).

Figure 6:
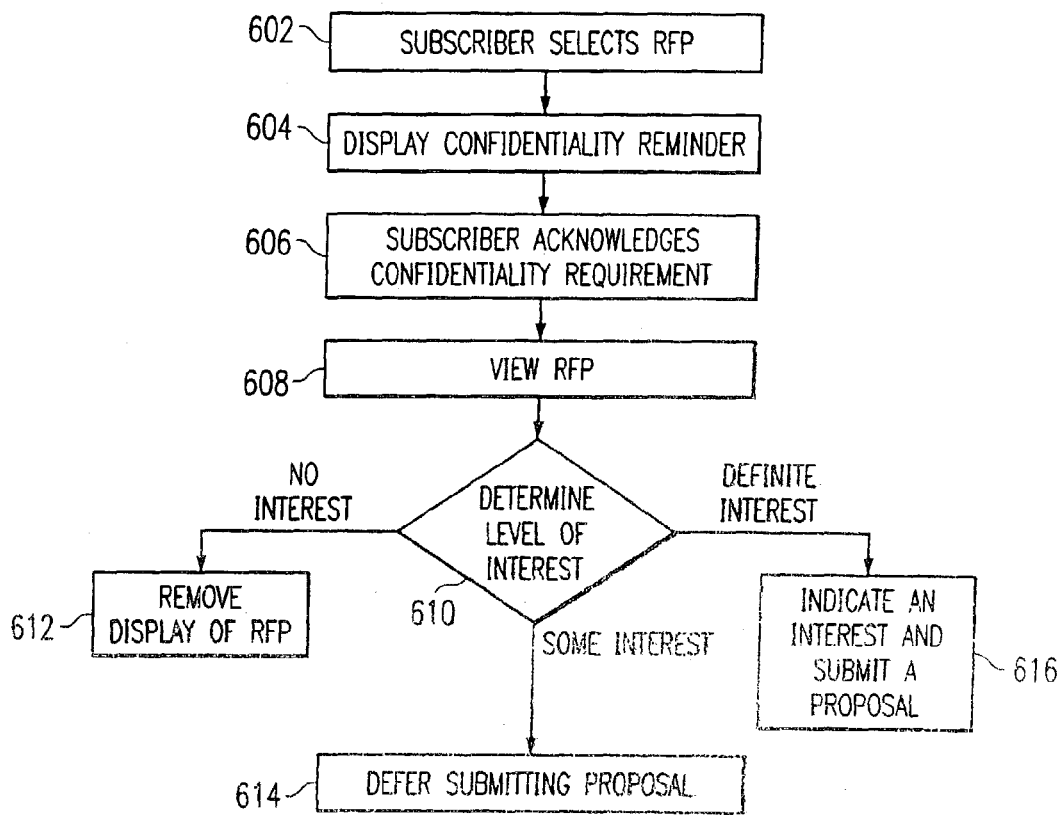
FIG. 6 is a flowchart depicting how a subscriber can review a RFP.

FIG. 6 illustrates how a subscriber can respond to a RFP. Initially, the subscriber selects an index item that represents a RFP to obtain additional information on a specific RFP (602). In response to the subscriber's selection, the host site displays a "pop-up" window that reminds the subscriber that the information contained in that listing is deemed confidential in accordance with the applicable provisions of the subscription enrollment agreement and prevailing standards of professional and ethical conduct (604). The subscriber must affirmatively acknowledge and agree to these provisos or otherwise cancel/back out of access to said listing (606). This "pop-up" window may be accompanied by one or more additional successive "pop-up" windows, which may require the subscriber to confirm its understanding that (1) the RFP entails services to be provided in a particular state, court or locale, (2) it is duly licensed and otherwise qualified to provide services in that area, and (3) depending on the COI protocol specified by the listing client, no conflict of interest exists to the extent the subscriber can check for such a conflict in light of the information provided in the RFP.

These checks are necessary, because, in order to advise and represent clients effectively in a broad array of matters, it is essential that attorneys be provided critical information of a highly sensitive nature pertaining to core interests of the client (e.g., trade secrets) on almost a routine basis. Information of such character, as compared to less sensitive proprietary information, is only rarely, made available to other types of service providers, including those dealing in other professional services; these other exceptions, and any recognized privileges of confidentiality associated with same are limited in scope, such as the accountant-client privilege. By contrast, to promote the flow of highly sensitive information from client to attorney to best assure effective legal representation, attorney-client privileges are both well-recognized and accorded broad scope in virtually all Western cultures. At the same time, those privileges are also derivative of one of the fundamental precepts of the legal profession, being that of absolute fidelity to the client as against all others; this duty mandates that legal professionals avoid any actual or potential conflict of interest so as to not place themselves in a position of having divisive interests as between themselves and their clients, or divided loyalties as between two or more clients.

Having selected a specific RFP item from the listing index for actual review if/after navigating any initial "pop-up" windows regarding stipulation/acknowledgment of confidentiality, initial COI checks and/or eligibility requirements, if the listing selected is one that is anonymous, the subscriber may next encounter an abstract version of the listing incident to a further COI check pertaining to substantive core interest work activity and/or a listing of third parties identified as having interests adverse to those of the listing client, again requiring affirmative confirmation that no actual or probable COI exists as a prerequisite to obtaining further access to that listing.

Figure 7:
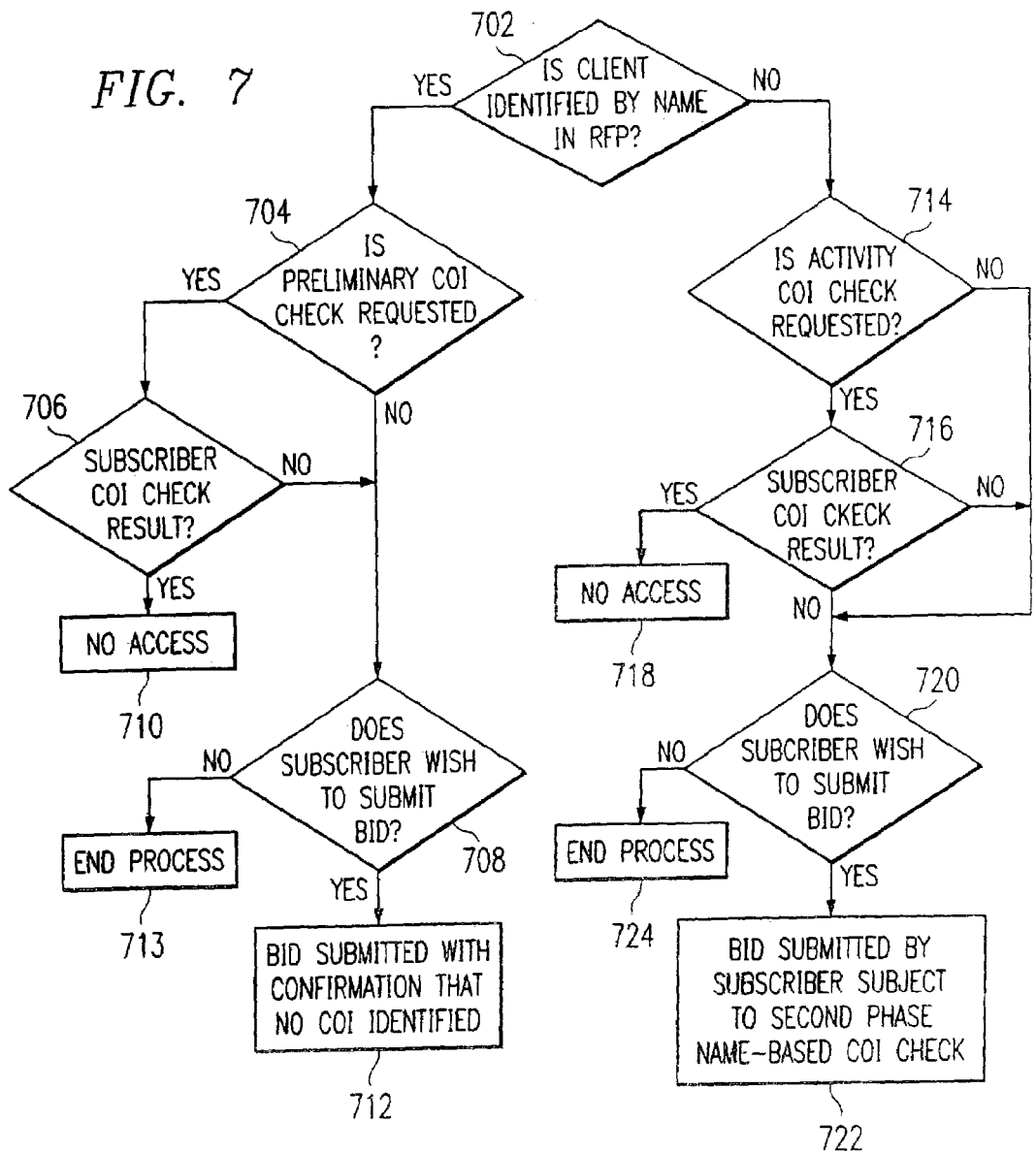
FIG. 7 is a flowchart depicting how conflict of interest issues are resolved in the process of gaining access to a RFP.

FIG. 7 is a flowchart that depicts in detail how COI issues are resolved in the process of gaining access to a RFP. Initially, the subscriber determines whether the listing client is identified by name (or by some other means) in the RFP (702). If the listing client did identify themselves, a check is made to determine whether the listing client requested that a preliminary COI check be conducted by the subscriber prior to gaining access to the entire contents of the RFP (704). If the listing client did require that a preliminary COI check be conducted, the subscriber is required to perform such a check. If the subscriber's COI check resulted in the identification of a conflict (706), the subscriber will not be given access to any further information contained in the RFP (710). If the listing client did not request that a preliminary COI check be conducted, or if they did request that such a check be conducted and the results of the check were negative (706), the subscriber then determines whether it wishes to submit a bid for the particular RFP (708). If the subscriber does submit a bid, the bid is submitted along with a notation that no COI was identified (712). On the other hand, if the subscriber does not wish to submit a bid, the process ends (713), with respect to the COI issues.

If the client did not identify themselves in the RFP, the subscriber determines whether the listing client requested that an activity-based COI check be performed (714). If such a COI check is requested, the subscriber will perform such an investigation. If an activity-based COI check identifies a problem (716), the subscriber will be given no further access to the RFP (718). Alternatively, if no activity-based COI is found, or if no activity-based COI is requested, the subscriber then determines whether or not it wishes to submit a bid (720). If the subscriber does submit a bid, the bid is subject to the subscriber conducting a second phase COI check based on the name of the listing client after the client identifies itself (722). The listing client can identify itself to any number of attorneys or firms that submit bids in response to its RFP. If the subscriber does not wish to submit a bid for the RFP, the process ends (724), with respect to the COI issues.

Subject to any such secondary COI check prerequisites, the subscriber then obtains access to a full text version of the selected RFP (608), which will typically contain a more detailed listing of the services needed together with any additional specifications as are required or desired by the listing client to be addressed in a responsive proposal to provide such services. In this regard, for example, certain types of legal services are such to be almost of a generic character, such as collections on credit card accounts that are in arrears and in default for non-payment under the terms of the issuer's account agreement, and the amount of the credit extended falls within a given range (e.g. $5000 to $10,000 each); the listing client may specify that it requires or desires a flat-rate-per-account bid (and perhaps not to exceed a given ceiling) or may specify that it requires or desires a contingent fee arrangement bid based on either a stated or proposed percentage of the balances collected. By way of further example, in the instance of other service needs which are or may not be susceptible to either flat rate or contingent fee arrangements, the listing client may specify that it requires or desires that responsive proposals be premised on a "blended" or composite hourly fee, or alternatively that they should simply delineate the proffered hourly fee rates for all persons or staff levels which the subscriber proposes to have provide those service needs, together with a preliminary estimate or estimated range of the billable hours that may be required to meet those needs. Other specifications may not be price-related, such as a request for references, a proposed staffing schedule, or a summary or more detailed delineation of previous experience in the particular area(s) involved.

Following initial review of a given RFP listing, the subscriber will make some determination as to whether or not it is interested in submitting a proposal (610), and is afforded the options of (i) if the subscriber has already determined it has no interest in submitting a response, indicating the same, triggering a "pop-up" reminder/reconfirmation that the information contained therein is deemed confidential incident to exiting the listing (612); (ii) deferring an indication of interest pending further consideration and/or review of other current listings, triggering a similar "pop-up" screen regarding confidentiality, with an advisory that the listing has been electronically "flagged" as having been deferred pending further consideration (614); and (iii) otherwise indicating affirmative interest in the RFP and submitting a responsive proposal (616).

A subscriber's confirmation of affirmative interest in submitting a proposal enables additional functions of the host site, including (i) the enablement of a print capability; (ii) the enablement of a "free form" response form, with (iii) an active "toggle" capability; allowing the subscriber to flip back and forth between the RFP listing and response form screens; and (iv) the disclosure of any contact information, provided by the listing client for subscribers who need clarification of some aspect of, and/or any additional information pertinent to, the RFP in question; in addition, ideally, the listing client has provided its RFP listing in a format which enables the host site to generate a "mirror image" response form which makes provisions for the subscriber's inclusion of information pertinent to all mandatory response criteria specified by the listing client, as well as provisions for inclusion of any additional information which is either designated to be optional by the listing client or as is otherwise being supplied by the subscriber supplementally at its own option.

It is noted that the limited enablement of a print capability of documents from the host site database by subscribers represents an additional security feature of the present invention, in this instance such that only subscribers who have affirmatively negotiated all prior COI checkpoints, met all preemptive eligibility requirements, affirmatively acknowledged the confidentiality of information provided by the RFP listing client, and that have additionally expressly affirmed their interest in submitting a response to a given RFP, are only then able to obtain a hard copy of the RFP listing; nevertheless, activation of the print function at this juncture triggers another "pop-up" window requiring the subscriber to reconfirm the confidentiality and non-dissemination of the copy of the RFP being provided. Printer capability enablement is otherwise only available to subscribers for the limited purposes of printing copies of (i) the subscriber's agreement(s) with the site host; (ii) any pertinent site-generated electronic invoices, if any; (iii) copies of any RFP responses submitted by the subscriber; (iv) electronic log confirmations of RFP response submissions by that subscriber; and (v) a copy of a given RFP listing index accessed by the subscriber, solely for purposes of being able to disseminate same among the members of a subscriber firm; selection of the last enablement function also triggers a confidentiality/non-dissemination "pop-up" caveat requiring further separate confirmation.

AUTO-CONFLICTS FEATURE

The Auto-Conflicts feature further enhances the ability of the present invention to allow subscribers and listing clients to detect and avoid COIs. In a preferred embodiment of the present invention, the Auto-Conflicts feature is incorporated into the program described above. The Auto-Conflicts feature allows subscribers to specify entities with whom they have an existing or prospective client relationship (collectively referred to below as the "subscriber's clients") and entities with whom the subscriber has an existing or prospective adversarial relationship (collectively referred to below as the "subscriber's opponents"). In a similar manner, listing clients specify entities with which they are affiliated and/or aligned (collectively referred to below as the "listing client's affiliates") and those entities that are aligned against them (the "listing client's opponents"). After this Auto-Conflicts information has been entered, the computer system implementing the present invention compares the subscriber's clients to the listing client's opponents and the subscriber's opponents to the listing clients affiliates when deciding whether to make a listing client's RFP available to a particular subscriber. Matches found during these comparisons indicate that a potential COI may exist. If a potential COI is found, the RFP submitted by the listing client will not be made available to that particular subscriber.

Figure 8:
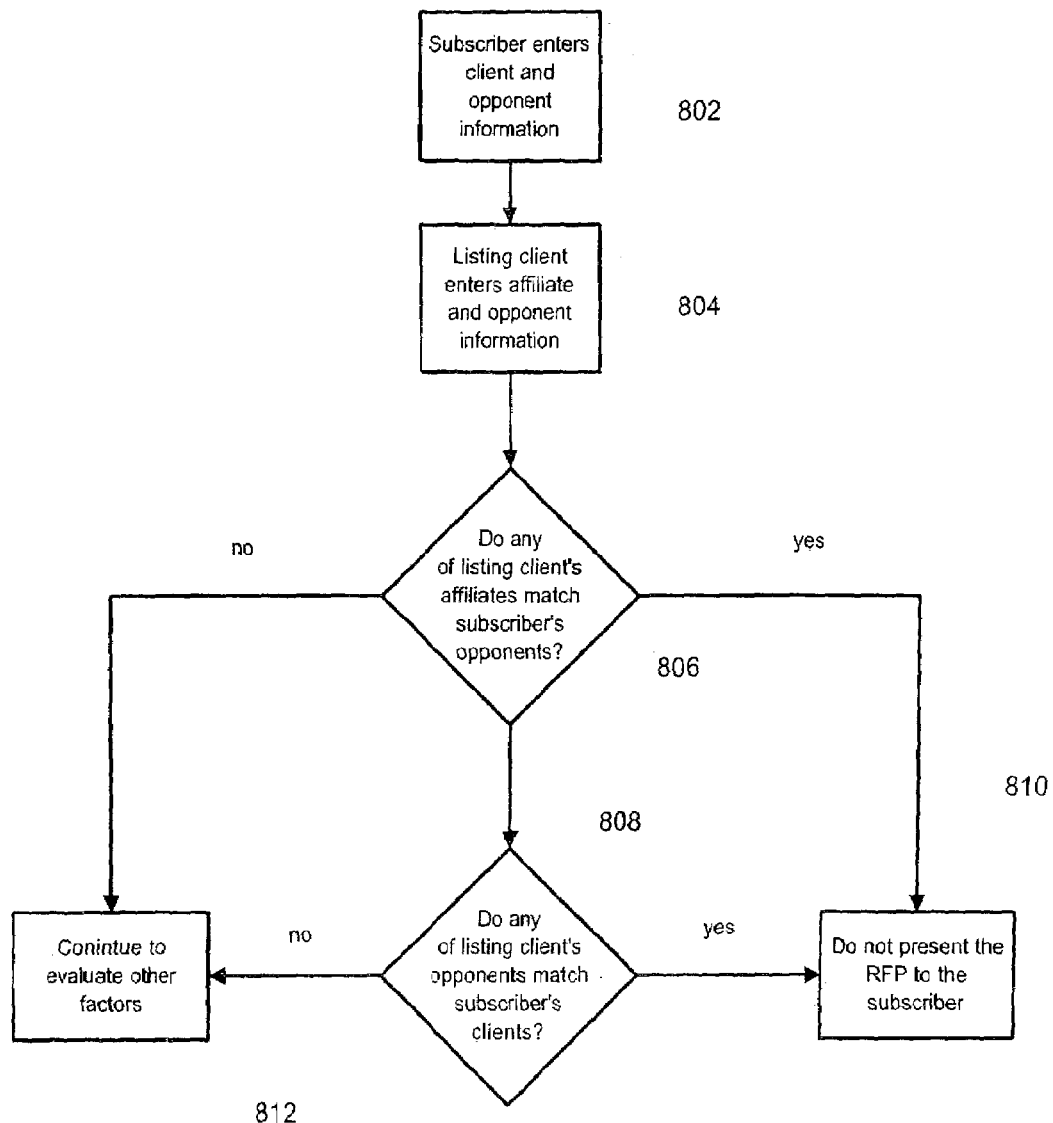
FIG. 8 is a flowchart showing how subscribers and listing clients can enter information relating to potential conflicts of interest, and how the present invention uses this information.

FIG. 8 depicts the process by which subscribers and listing clients enter information for use by the Auto-Conflicts feature of the present invention, and how the present invention implements the Auto-Conflicts feature. Initially, a subscriber enters information about the subscriber's clients and the subscriber's opponents (802). In a preferred embodiment of the present invention, step 802 is implemented as part of step 302, shown in FIG. 3. The subscriber also specifies whether the identity of its opponents and clients can be disclosed to listing clients.

Listing clients also enter information about their affiliates and opponents (804). Listing clients are free to enter the names of as many entities as they want (including none). Examples of possible listing client affiliates include parent corporations, subsidiaries, codefendants, and business partners. Possible listing client opponents may include entities that have sued the listing client, major competitors, and the like. In a preferred embodiment of the present invention, listing clients enter this information as part of step 204, shown in FIG. 2.

While entering the information described above, subscribers and listing clients are notified that each additional entity they list increases the chances that the Auto-Conflicts feature will determine that a potential COI exists between the listing client and a particular subscriber. In the case of subscribers, each additional entity listed will tend to decrease the number of RFPs that they will be able to view, since the present invention will not allow a subscriber to view a RFP if it determines that a potential COI exists between that subscriber and the listing client that submitted the RFP. The same is true for listing clients. The more entities the listing client enters in step 804, the greater the chance will be that the Auto-Conflicts feature will determine that a potential COI exists between the listing client and a particular subscriber. This will decrease the number of subscribers that will be able to view the listing client's RFP because, as mentioned above, a subscriber will not be able to view a RFP from a particular listing client if a potential COI is determined to exist.

After the subscribers and listing clients have entered the information described above, the present invention looks for matches between information entered by a listing client about its affiliates and opponents, and the information entered by subscribers about their clients and opponents. In a preferred embodiment of the present invention, this step is executed between steps 502 and 504 of the process shown in FIG. 5. Specifically, for a particular RFP and the listing client who submitted it, the computer system operating according to the present invention first compares the listing client's affiliates with the opponents entered by a particular subscriber (806). If a match is encountered, the subscriber will not be able to view the particular RFP (810). Next, the listing client's opponents are compared to the subscriber's clients (808). Again, if a match is encountered, the particular RFP will not be shown to the particular subscriber. If no matches are encountered during the comparisons, the present invention will continue to evaluate the factors listed in steps 504-512 to determine if the RFP should be included on the particular subscriber's list of RFPs (812).

The listing client is ultimately in control of how the Auto-Conflicts feature is utilized, since the listing client is under no obligation to enter any information about the identity of the listing client's affiliates or opponents. As described above, the listing client's information about its affiliates and opponents applies to all of the RFPs submitted by that listing client. In another embodiment of the present invention, however, the listing client is able to specify different information for different RFPs. In this embodiment, the listing client is able to either create a list of affiliates and opponents for a particular RFP, or can select an option to prevent the submission of any affiliate and/or opponent information for a particular RFP.

Figure 9:
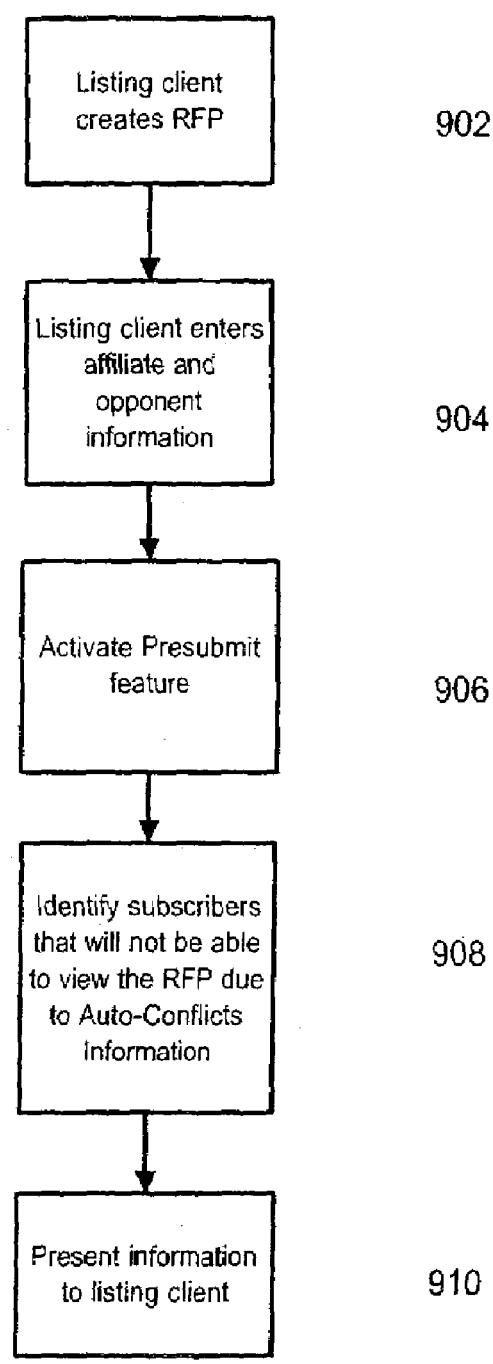
FIG. 9 is a flowchart showing how a listing client can presubmit a RFP.

In addition, the client can "presubmit" a particular RFP to determine how many subscribers are prevented from viewing the particular RFP due to the listing client's affiliate and opponent information. This functionality is shown in FIG. 9. By "presubmitting" the RFP, the present invention determines how many subscribers, which would otherwise be able to view the RFP, are prevented from viewing the RFP due to the listing client's Auto-Conflicts information for the RFP. Initially, the listing client creates a RFP (902). As described above, the RFP specifies the subscribers, either by name, practice area, or other qualification. The listing client also enters the appropriate affiliate and opponent information (904). The listing client then activates the "presubmit" feature (906). The computer system implementing the present invention then determines the number of subscribers that will be prevented from viewing this RFP based on the Auto-Conflicts information specified by the listing client and the respective subscribers (908). The listing client is then presented with the results for this determination (910).

In a preferred embodiment of the present invention, the listing client will only be shown the number of firms that will not be able to view its RFP due to the Auto-Conflicts information. For example, after "presubmitting" a RFP, the listing client may be presented with a message that states "17 out of 35 Subscribers whose profiles otherwise meet your specifications will not be able to view this RFP based on the Auto-Conflicts information associated with the RFP." In alternate embodiments of the present invention, the listing client may be presented with additional information. This additional information may specify why the RFP would not be able to be viewed by the seventeen firms. For example, the listing client could be presented with a message that states "5 Subscribers had a potential conflict of interest with your Affiliates, 8 Subscribes had a potential conflict of interest with your Opponents, and 5 Subscribers had potential conflicts of interest with your Affiliates and Opponents."

In either embodiment, the listing client can modify the information contained in its RFP to increase (or decrease) the number of subscribers that will be able to view the RFP. Some of the information that could be modified includes the specified geographic area, practice areas, areas of expertise, etc. In addition, the listing client can also modify its affiliate and opponent information to allow for more subscribers to view the RFP.

The Auto-Conflicts and "presubmission" features also work in conjunction with the private listing feature described above. When a listing client creates a private list of the subscribers it wants to receive a particular RFP (see step 204 in FIG. 2), the Auto-Conflicts feature displays separate icons next to each subscriber the listing client has selected to indicate whether the subscriber has submitted any information about the subscriber's clients or opponents. The appearance of these icons also indicates whether the subscriber had designated that its client and opponent information can be viewed by the listing client or not, as does the underlining of the subscriber's name. If the subscriber's name is underlined, the listing client can view the information by selecting the subscriber's name. FIG. 10 depicts a screen that allows a client to specify which firms should be included in its private listing (and which ones it has already selected, as indicated by the "x" notation in the far left column), along with icons indicating what Auto-Conflicts information the various subscribers have submitted, and the status of this information. Upon presubmitting its RFP in a private listing, the listing client will be shown the subscribers that will receive its RFP, based on the information currently associated with the RFP. If the listing client is not satisfied with the number of subscribers, it can modify the information associated with the RFP before actually submitting the RFP.

As indicated above, aspects of this invention pertain to specific "method functions" implementable on computer systems. In an alternate embodiment, the invention may be implemented as a computer program product for use with a computer system. Those skilled in the art should readily appreciate that programs defining the functions of the present invention can be delivered to a computer in many forms, which include, but are not limited to: (a) information permanently stored on non-writable storage media (e.g. read only memory devices within a computer such as ROMs or CD-ROM disks readable only by a computer I/O attachment); (b) information alterably stored on writable storage media (e.g. floppy disks and hard drives); or (c) information conveyed to a computer through communication media, such as a local area network, a telephone network, or a public network like the Internet. It should be understood, therefore, that such media, when carrying computer readable instructions that direct the method functions of the present invention, represent alternate embodiments of the present invention.

While the invention has been particularly shown and described with reference to a preferred embodiment, it will be understood by those skilled in the art that various changes in form and detail may be made therein without departing from the spirit and scope of the invention.

The invention claimed is:

1. A method for electronically exchanging legal and legal-related information between clients and service providers that protects the confidentiality of a client's information and avoids creating conflicts of interest, comprising:
    providing a host site computer;
    providing a client computer in communication with the host site computer;
    providing a service provider computer in communication with the host site computer;
    creating a client's request for proposal (RFP) on the client computer and entering information that identifies some of the client's opponents;
    creating a service provider profile on the service provider computer and entering information that identifies some of the service provider's clients;
    transmitting the client's RFP and the information identifying the client's opponents to the host site computer;
    transmitting the service provider profile and the information identifying the service provider's clients to the host site computer;
    comparing the information identifying the client's opponents to the information identifying the service provider's clients to determine if the service provider should be allowed access to the client's RFP;
    refusing to provide the service provider with access to the client's RFP if a match indicating that a potential conflict of interest exists is found during the comparison of the information identifying the client's opponents to the information identifying the service provider's clients.

2. A method for electronically exchanging legal and legal-related information between clients and service providers that protects the confidentiality of a client's information and avoids creating conflicts of interest, comprising:
    providing a host site computer that is in communication with a client computer and a service provider computer;
    receiving at the host computer from the service provider computer the service provider's profile and information that identifies the service provider's clients and opponents;
    receiving at the host computer from the client computer the client's request for proposal (RFP) and information that identifies the client's affiliates and client's opponents;
    comparing the information identifying the client's opponents and affiliates to the information identifying the service provider's clients and opponents to determine if client's RFP should be made available to the service provider; and
    refusing to provide the service provider with access to the client's RFP if a match indicating that a potential conflict of interest exists is found during the comparison of the information identifying the client's opponents and affiliates to the information identifying the service provider's clients and opponents.

3. The method as described in claim 2, further comprising:
    notifying the client that each additional opponent or affiliate listed in the information provided by the client increases the chances that the comparison step will determine a potential conflict of interest exists between the client and a particular service provider.

4. The method as described in claim 2, further comprising:
    notifying the service providers that each additional opponent or affiliate listed in the information provided by the service provider decreases the number of RFP's that the service provider will be able to view.

5. The method as described in claim 2, wherein the receiving at the host computer from the client computer step further comprises:
    receiving at the host computer from the client computer information that specifies different information about the client's affiliates and opponents for different RFPs.

6. The method of claim 5, wherein the different information received comprises a list of affiliates and opponents for a particular RFP.

7. A method for electronically exchanging legal and legal-related information between clients and service providers that protects the confidentiality of a client's information and avoids creating conflicts of interest, comprising:
    providing a host site computer that is in communication with a client computer and a service provider computer;
    receiving at the host computer from the service provider computer the service provider's profile and information that identifies the service provider's clients and opponents;
    receiving at the host computer from the client computer the client's request for proposal (RFP) and information that identifies the client's affiliates and client's opponents;
    comparing the information identifying the client's affiliates to the information identifying the service provider's opponents to determine if client's RFP should be made available to the service provider; and
    refusing to provide the service provider with access to the client's RFP if a match indicating that a potential conflict of interest is found in the comparison of the information identifying the client's affiliates to the information identifying the service provider's opponents.

8. The method of claim 7, further comprising:
comparing the information identifying the client's opponents to the information identifying the service provider's clients to determine if client's RFP should be made available to the service provider; and
refusing to provide the service provider with access to the client's RFP if a match indicating that a potential conflict of interest exists is found during the comparison of the information identifying the client's opponents to the information identifying the service provider's clients.

9. A method for electronically exchanging legal and legal-related information between clients and service providers that protects the confidentiality of a client's information and avoids creating conflicts of interest, comprising:
providing a host site computer that is in communication with a client computer and a service provider computer;
receiving at the host computer from the service provider computer the service provider's profile and information that identifies the service provider's clients and opponents;
receiving at the host computer from the client computer the client's request for proposal (RFP), information that specifies service providers, client's affiliates and opponents, and an activation of a presubmit feature, wherein such presubmit feature determines how many service providers are prevented from access to the client's RFP;
comparing the information identifying the client's opponents to the information identifying the service provider's clients to determine if the service provider should be allowed access to the client's RFP;
comparing the information identifying the client's affiliates to the information identifying the service provider's opponents to determine if the service provider should be allowed access to the client's RFP;
determining the number of service providers that will be prevented from having access to the RFP based on the information provided by the client and the service providers; and
transmitting to the client computer the number of service providers that will be prevented from having access to the RFP based on the information provided by the client and the service providers.

10. The method of claim 9, wherein the transmitting to the client computer step further comprises:
transmitting additional information specifying why the RFP would not be viewed by service providers.

11. The method of claim 9, further comprising;
after transmitting to the client computer the number of service providers that will be prevented from having access to the RFP based on the information provided by the client and the service providers, receiving at the host computer from the client computer modifications to the affiliate and opponent information.

12. A method for electronically exchanging legal and legal-related information between clients and service providers that protects the confidentiality of a client's information and avoids creating conflicts of interest, comprising:
providing a host site computer that is in communication with a client computer and a service provider computer;
receiving at the host computer from the service provider computer the service provider's profile and information that identifies the service provider's clients and opponents;
receiving at the host computer from the client computer the client's request for proposal (RFP), information that specifies service providers, client's affiliates and opponents, a private listing of service providers the client wishes to receive the RFP, and activation of a presubmit feature, wherein such presubmit feature determines how many service providers on the private listing are prevented from access to the client's RFP;
comparing the information identifying the client's opponents to the information identifying the service provider's clients to determine if the service provider should be allowed access to the client's RFP;
comparing the information identifying the client's affiliates to the information identifying the service provider's opponents to determine if the service provider should be allowed access to the client's RFP;
determining the number of service providers that will be prevented from having access to the RFP because of a match indicating that a potential conflict of interest exists found during the comparison of the information identifying the client's opponents and affiliates to the information identifying the service provider's clients and opponents; and
transmitting to the client computer the number of service providers on the private listing that will receive the RFP.

13. The method of claim 12, further comprising,
transmitting for display on the client computer separate icons next to each service provider included in the client's private listing of service providers, wherein the icons indicate whether the service provider has submitted any information about the service provider's clients or opponents.

14. The method of claim 13, wherein,
the separate icons indicate whether the service provider had designated that its client and opponent information can be viewed by a client.

15. The method of claim 12, further comprising:
after transmitting to the client computer the number of service providers on the private listing that will receive the RFP, receiving at the host computer from the client computer modifications to the information associated with the RFP before submitting the RFP.

16. A computer system for electronically exchanging legal and legal-related information between clients and service providers that protects the client's confidential information and avoids creating conflicts of interest, comprising:
a host site computer that is in communication with a client computer and a service provider computer, wherein the host computer operates in communication with the client computer and the service provider computer as follows:
the host computer receives from the client's computer a client's request for proposal (RFP) and information that identifies the client's affiliates and client's opponents;
a client's conflict of interest protocol is created on the host site computer;
the host computer receives from the service provider's computer a service provider's profile and information that identifies the service provider's clients and service provider's opponents;
the host computet compares the information identifying the client's opponents to the information identifying the service provider's clients to determine if the service provider should be allowed access to the client's RFP;

the host computer refuses to provide the service provider with access to the client's RFP if a match indicating that a potential conflict of interest exists is found during the comparison of the information identifying the client's opponents to the information identifying the service provider's clients.

17. The computer system as described in claim 16, further operating as follows:

receiving at the host computer from the client computer information that specifies different information about the client's affiliates and opponents for different RFPs.

18. The computer system of claim 17, wherein the different information received comprises a list of affiliates and opponents for a particular RFP.

19. A computer system for facilitating clients engaging subscribers to provide legal and legal-related services that protects the client's confidential information and avoids creating conflicts of interest, comprising:

a host site computer that is in communication with a client computer and a service provider computer, wherein the host computer operates in communication with the client computer and the service provider computer as follows:

the host computer receives a client's request for proposal (RFP) from the client computer, wherein the client's RFP includes information about a legal-related need that prompted the client to seek to engage a subscriber to provide services to assist the client with respect to that need and screening criteria for determining whether a particular subscriber can view the client's RFP;

a client's conflict of interest protocol is created on the host site computer;

the host computer receives a subscriber profile from the subscriber computer, wherein the subscriber profile includes qualifications of the subscriber and conflict information which can be used to screen for possible conflicts of interest regarding the subscriber's representation of the client with respect to the client's legal-related need;

the client's identity is transmitted by the host computer to the subscriber computer;

the result of a conflict of interest check conducted by the subscriber is received by the host computer from the subscriber computer; and allowing the subscriber access to the client's RFP on the host site computer and to respond with a proposal to provide services to the client regarding the client's legal-related need as described in the client's RFP if the host site computer receives an affirmative confirmation from the subscriber computer that the subscriber does not have a conflict of interest.

20. The computer system as described in claim 19, wherein the client's RFP includes at least one of an identity of the client, an identity of a service provider, a practice orientation of the service provider, a description of services required by the client, and a geographic location.

21. The computer system as described in claim 19, wherein the service provider profile includes at least one of an identity of the service provider, an area of expertise of the service provider, a geographic location, and a practice orientation of the service provider.

22. The computer system as described in claim 19, wherein the particular mode of operation further includes the host site computer prompting the service provider with a confidentiality notice to which the service provider must affirmatively respond before the service provider is allowed to view a particular RFP.

23. The computer system as described in claim 19, wherein the host site maintains an active index of client RFPs, the active index available to the service provider being dependant upon information contained in clients' RFPs and the service provider profile.

24. The computer system as described in claim 19, wherein in the mode of operation, the host site computer requires the service provider to acknowledge a confidentiality requirement before allowing the subscriber to print the RFP.

* * * * *